United States Patent [19]
Honda et al.

[11] Patent Number: 6,037,191
[45] Date of Patent: Mar. 14, 2000

[54] METHOD FOR PROCESSING SINGLE-CRYSTAL SEMICONDUCTOR WAFER FOR FLUORESCENT DISPLAY DEVICE

[75] Inventors: Kenichi Honda; Sadao Takano; Toshihide Hirayama; Yoshio Makita; Akihiro Azeta, all of Mobara, Japan

[73] Assignee: Futaba Denshi Kogyo K.K., Mobara, Japan

[21] Appl. No.: 09/064,169

[22] Filed: Apr. 22, 1998

[51] Int. Cl.[7] .................................................. H01L 21/44
[52] U.S. Cl. ........................... 438/114; 438/465; 427/157
[58] Field of Search .............................. 438/33, 113, 114, 438/465, 68, 460, 106; 427/157

[56] References Cited

U.S. PATENT DOCUMENTS 5,597,767  1/1997  Mignardi et al. ........................ 438/14
5,789,857  8/1998  Yamaura et al. ........................ 313/495
5,872,046  2/1999  Kaeriyama et al. ..................... 438/465

*Primary Examiner*—Joni Chang
*Assistant Examiner*—Kurt Eaton
*Attorney, Agent, or Firm*—Oblon, Spivak, Maier & Neustadt, P.C.

[57] ABSTRACT

A method for processing a single-crystal semiconductor wafer is provided which is capable of minimizing a dead space to maximize the number of elements per one wafer and preventing leakage luminescence and a reduction in luminance. A phosphor is deposited on each of a plurality of regions defined in the wafer at predetermined intervals and a water-resistant protective film is formed on the phosphor. Then, the wafer is cut for every one of the regions by means of a dicing saw using cutting water, to thereby provide a plurality of chips. The chips are subject to calcination during a calcination step in manufacture of fluorescent display device in which the chips are used as a display section, resulting in the protective film being evaporated.

5 Claims, 4 Drawing Sheets

METHOD FOR PROCESSING SINGLE-CRYSTAL SEMICONDUCTOR WAFER FOR FLUORESCENT DISPLAY DEVICE

BACKGROUND OF THE INVENTION

This invention relates to a method for processing a single-crystal semiconductor wafer, and more particularly to a method for processing a single-crystal semiconductor wafer for a fluorescent display device in semiconductor techniques, display techniques and the like.

Processing of a monocrystalline or single-crystal semiconductor wafer which has been conventionally carried out typically utilizes cutting by a dicing saw or formation of a line-like or stripe-like notches by a diamond cutter or cemented carbide blade cutter.

Breaking or cutting of a single-crystal semiconductor wafer by a dicing saw is carried out by means of cutting water. Such cutting water exhibits three functions or cooling characteristics of preventing an increasing in temperature of a cutting blade of the dicing saw due to frictional heat, cleaning characteristics of washing off swarf or cuttings produced during the cutting, and lubricating characteristics of reducing wearing of the blade during the cutting.

The above-described three functions are essential to cutting of a single-crystal semiconductor wafer by the dicing saw. In particular, in order to permit the cutting water to exhibit cleaning characteristics of removing swarf produced by the cutting, it is required to jet cutting water toward the blade.

However, a phosphor of a fluorescent display device is made of a water-soluble photosensitive material, resulting in failing to exhibit water-resistance. Thus, when cutting water is sprayed on the single-crystal semiconductor wafer under a pressure increased to a degree, it causes the phosphor coated on a picture cell on the single-crystal semiconductor wafer to be peeled from the semiconductor wafer.

Thus, in the prior art, cutting of the single-crystal semiconductor wafer has been carried out in any one of the following ways.

More specifically, a first way is that when the dicing saw is used, a dead space for a cut line of 2 mm or more is defined so as to prevent dissolution of the water-soluble photosensitive material due to spreading of cutting water around the cutting blade of the dicing saw during cutting of the wafer by the dicing saw from affecting the phosphor for the picture cell.

A second way is that line-like or stripe-like notches is formed on the single-crystal semiconductor wafer by means of a diamond cutter or a cemented carbide blade cutter, followed by breakage of the wafer in such a manner as seen in breakage of glass.

A third way is that half-cutting is carried out on the single-crystal semiconductor wafer by dicing prior to coating of the phosphor thereon and then the wafer is broken after the coating.

A fourth way is that after chips formed on the single-crystal semiconductor wafer are cut, the chips are coated thereon with a phosphor one by one.

The first way described above causes swarf to be left on a region of the single-crystal semiconductor wafer in proximity to a cut line when a reduction in amount of cutting water deteriorates cleaning characteristics of the cutting water. Also, putting of the swarf on the phosphor causes a reduction of luminance of the fluorescent display device and short-circuiting between element lines. Further, the first way requires to increase a width of the dead space for the cut line to a level as large as 2 mm or more so that scattering of the photosensitive material due to an increase in amount of cutting water to a degree sufficient to lead to dissolution of the water-soluble photosensitive material in the cutting water is kept from affecting the phosphor picture cell.

The second way causes generation of chippings increased in size, to thereby require to increase the dead space for the cut line as compared with dicing.

The third way causes the phosphor to be left in a dicing groove, so that the fluorescent display device in which the single-crystal semiconductor wafer is incorporated causes leakage luminescence at the cut line.

The fourth way, when slurry techniques are utilized therein, causes swelling of the phosphor on an edge of the chip, to thereby require separation between the edge of the chip and an element section of the chip. Unfortunately, this needs to increase the dead space to a dimension as large as about 10 mm.

Thus, in the fluorescent display device, the number of elements per one single-crystal semiconductor wafer is substantially varied depending on the dead space and an increase in dead space causes a reduction in number of elements per one wafer. Also, leakage luminescence as seen in the third way renders the fluorescent display device defective.

SUMMARY OF THE INVENTION

The present invention has been made in view of the foregoing disadvantage of the present invention.

Accordingly, it is an object of the present invention to provide a method for processing a single-crystal semiconductor wafer for a fluorescent display device which is capable of minimizing a dead space to maximize the number of elements per one single-crystal semiconductor wafer.

It is another object of the present invention to provide a method for processing a single-crystal semiconductor wafer for a fluorescent display device which is capable of providing a display device free of leakage luminescence, a decrease in luminance and any dot defect.

In accordance with the present invention, a method for processing a single-crystal semiconductor wafer for a fluorescent display device is provided for manufacture of chips coated thereon with a phosphor and used as a display section of a fluorescent display device. The method includes the steps of depositing a phosphor on each of a plurality of regions defined on the single-crystal semiconductor wafer at predetermined intervals, forming a protective film on the phosphor, and cutting the single-crystal semiconductor wafer for every one of the regions to prepare a plurality of chips.

In a preferred embodiment of the present invention, the single-crystal semiconductor wafer is cut by means of a dicing saw.

In a preferred embodiment of the present invention, the protective film is water-resistant, wherein cutting of the single-crystal semiconductor wafer is carried out using cutting water at a high pressure.

In a preferred embodiment of the present invention, the method further includes a step of removing the protective film from each of the chips.

In a preferred embodiment of the present invention, the protective film is removed by calcination of the chips.

In a preferred embodiment of the present invention, calcination of the chips is carried out in a calcination step in manufacturing of the fluorescent display device in which the chips are used as the display section.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENT

Now, a method for processing a single-crystal semiconductor wafer for a fluorescent display device according to the present invention will be described hereinafter with reference to the accompanying drawings.

Referring first to FIGS. 1 and 2(a) to 2(f), an embodiment of a method for processing a single-crystal semiconductor wafer for a fluorescent display device according to the present invention is illustrated.

Figure 1:
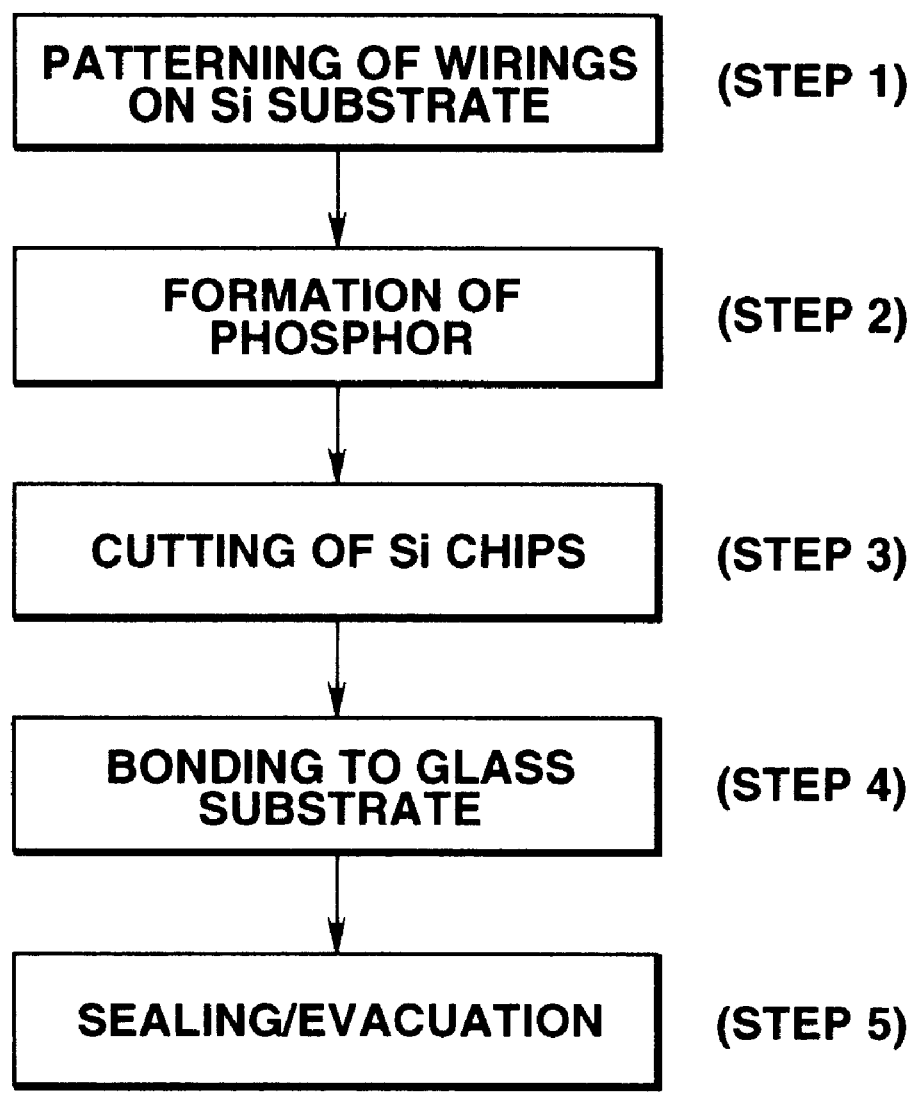
FIG. 1 is a flow chart showing manufacturing of a fluorescent display device using a Si single-crystal semiconductor wafer.
Figure 2A:
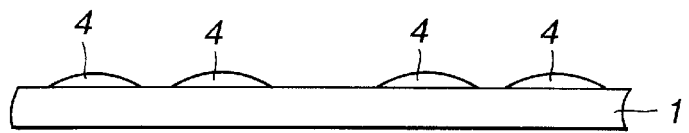
FIGS. 2(a) to 2(f) each are a schematic view showing each of steps in manufacturing of a fluorescent display device according to the present invention.

In a processing method of the illustrated embodiment, wirings are patterned on a Si single-crystal semiconductor wafer 1, resulting in switching elements being incorporated therein. Then, as shown in FIG. 2(a), two picture cells 2 are constructed for every switching element, so that the picture cells of 40 in a longitudinal direction and 80 in a lateral direction in number are arranged in a dot-like manner, resulting in formation of each one silicon chip 3 (step 1).

Figure 2B:
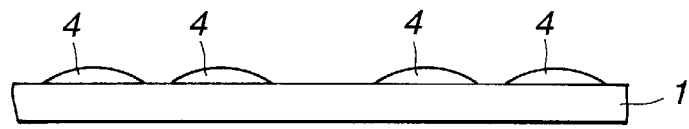
Figure 3:
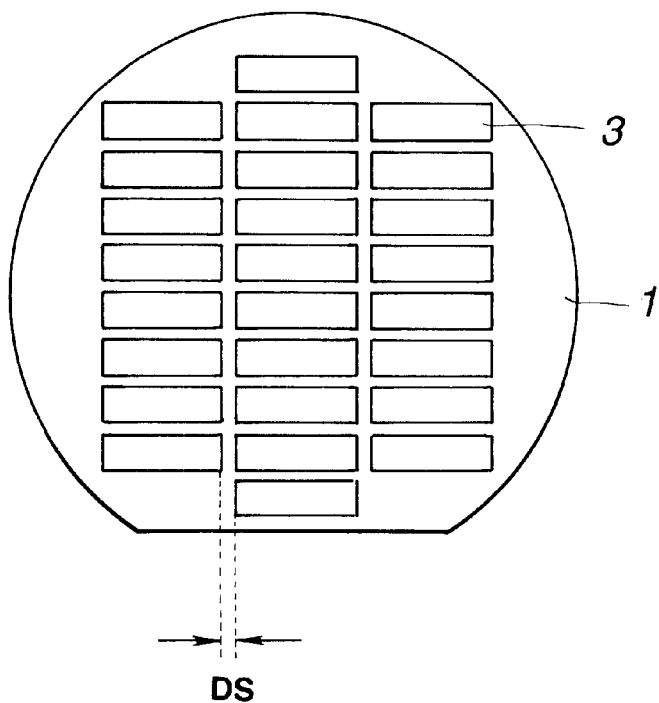
FIG. 3 is a schematic view showing chips formed on a Si single-crystal semiconductor wafer.

The silicon chips 3 thus formed are regularly arranged in a matrix-like manner on the Si single-crystal semiconductor wafer 1 as shown in FIG. 3. The silicon chips 3 adjacent to each other are spaced from each other at an interval or dead space DS of 50 μm. Then, as shown in FIG. 2(b), a phosphor 4 containing a water-soluble photosensitive material acting as a binder is coated on each of the picture cells 2 on the Si single-crystal semiconductor wafer 1 (step 2).

Figure 2C:
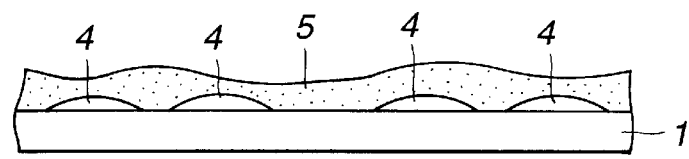

Then, a solution for a protective film 5 is prepared by dissolving 20 wt % of acrylic resin in 80 wt % of acetone and coated, by dropping, on Si single-crystal semiconductor wafer 1 which has been subject to pattering of the phosphor 4 as shown in FIG. 2(c).

Figure 2D:
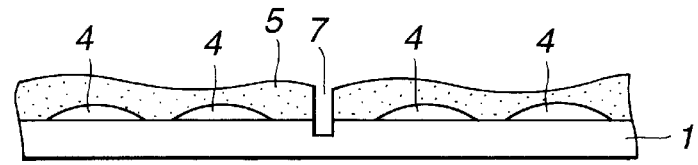
Figure 2E:
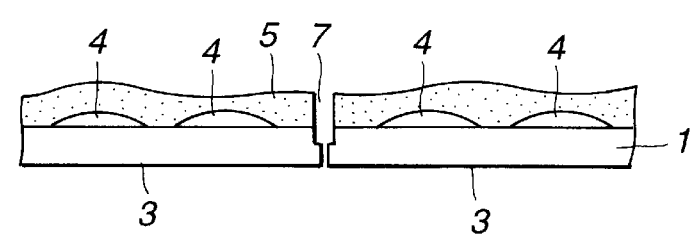

After the protective film or acrylic resin 5 is solidified by drying, line-like or stripe-like notches 7 are formed on the Si single-crystal semiconductor wafer 1 and acrylic resin 5 by means of a dicing saw 6, followed by breakage of the Si single-crystal semiconductor wafer 1 as shown in FIGS. 2(d) and 2(e). During formation of the stripe-like notches, cutting water is sprayed on both a blade 8 of the dicing saw 6 and the Si single-crystal semiconductor wafer 1 (step 3).

Subsequently, each of the Si single-crystal semiconductor wafers 1 thus broken is adhesively bonded to a glass substrate (step 4). Then, a front substrate is arranged so as to face the Si with a predetermined interval being defined therebetween. Thereafter, a spacer member is arranged between the front substrate and the glass substrate so as to extend over an outer periphery of both substrates, to thereby sealedly join both substrates to each other therethrough, resulting in an envelope being provided.

Figure 2F:
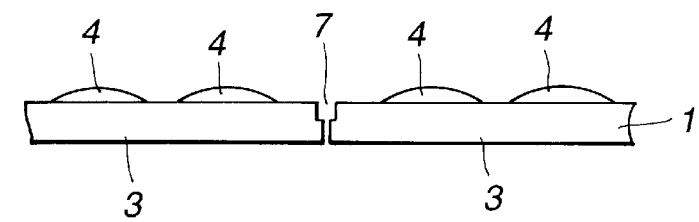

The envelope is exposed to a temperature of 400 to 500° C. for about 15 minutes during calcination of the phosphor in the envelop, so that the acrylic resin 5 solidified on the phosphor 4 may be evaporated as shown in FIG. 2(f).

Thereafter, the envelope is evacuated to a high vacuum. For this purpose, any residual gas produced in the envelope is removed by a getter, resulting in a fluorescent display device being completed (step 5).

Thus, the method of the illustrated embodiment effectively keeps the phosphor from being peeled or removed from the Si single-crystal semiconductor wafer 1 due to spraying of cutting water thereon, because the phosphor 4 is covered with the acrylic resin 5 during spraying of the cutting water. Thus, the illustrated embodiment permits the cutting water to be jetted under an elevated pressure, so that the cutting water may exhibit satisfactory cooling characteristics, cleaning characteristics and lubricating characteristics. In particular, such enhancement of cleaning characteristics of the cutting water permits swarf scattered on the Si single-crystal semiconductor wafer to be positively removed therefrom, to thereby prevent a reduction in luminance of the fluorescent display device and short-circuiting between element lines of the display device. Also, in the illustrated embodiment, formation of the line-like or stripe-like notches 7 is carried out by means of the dicing saw 6, so that chippings C produced may be reduced in size as compared with that by a diamond cutter.

Figure 5:
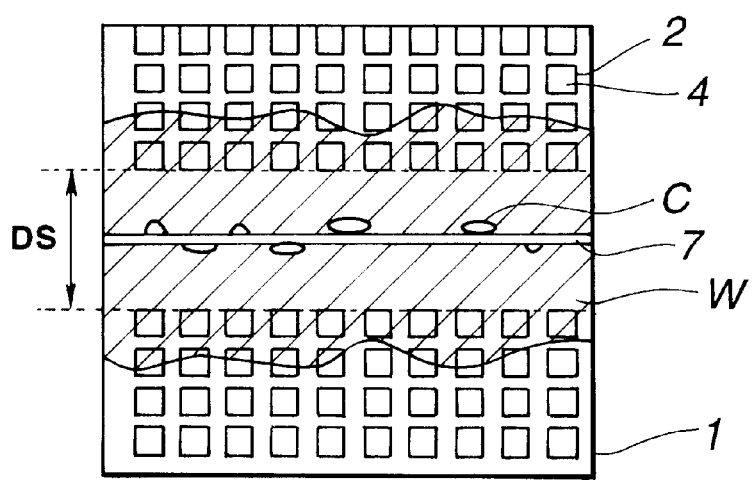
FIG. 5 is a schematic view showing a part of manufacturing of a fluorescent display device according to the present invention.
Figure 4B:
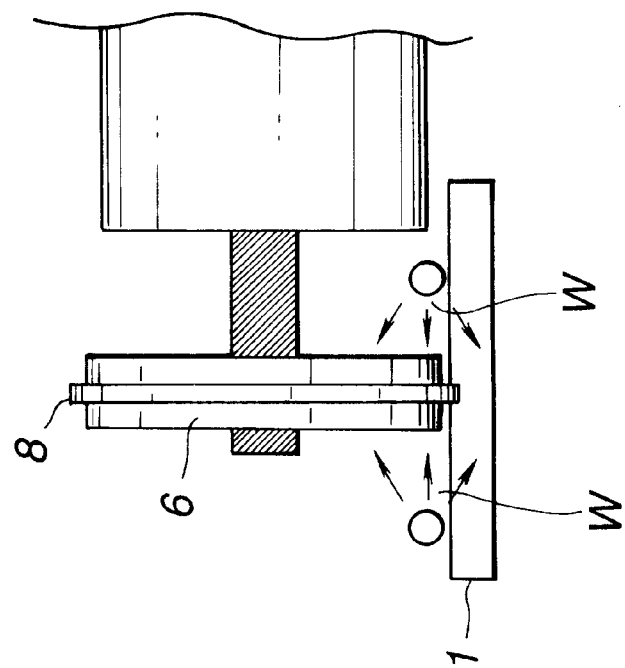
FIG. 4(b) is a front elevation view showing a single-crystal semiconductor wafer during cutting thereof by a dicing saw.
Figure 4A:
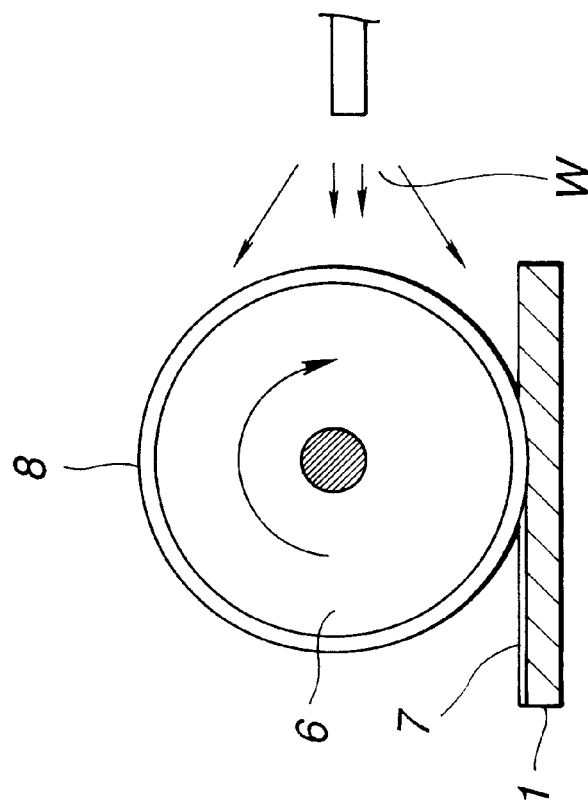
FIG. 4(a) is a side elevation view showing a single-crystal semiconductor wafer during cutting thereof by a dicing saw.

Thus, the illustrated embodiment, as shown in FIG. 5, permits a dead space DS for a cut line to be as small as 50 μm which is a dimension obtained by adding a positional accuracy of the device and a range of the chippings C to a thickness of the blade 8.

The acrylic resin film 5 covering the phosphor 4 during cutting of the single-crystal semiconductor wafer is evaporated during calcination of the phosphor, to thereby eliminate any additional step of removing the acrylic resin film 5.

In the illustrated embodiment, cutting of the Si single-crystal semiconductor wafer is carried out by forming the line-like or stripe-like notches 7 on the semiconductor wafer by means of the dicing saw 6, followed by breakage of the semiconductor wafer. Alternatively, full cutting of the semiconductor wafer by the dicing saw 6 may be substituted for the breakage.

Also, in the illustrated embodiment, the protective film 5 is made of acrylic resin. However, it may be made of a resin material other than acrylic resin, so long as it is solvent-soluble and water-resistant. In addition, in the illustrated embodiment, the Si single-crystal semiconductor wafer is used by way of example. The single-crystal semiconductor wafer may be made of a material other than Si, such as, for example, GaAs or the like.

As can be seen from the foregoing, the method of the present invention is so constructed that the phosphor deposited on the single-crystal semiconductor wafer is covered with the protective film, followed by cutting of the single-crystal semiconductor wafer. Such construction positively prevents swarf produced during cutting of the semiconductor wafer from contaminating or damaging the phosphor, to thereby ensure uniform luminescence of the phosphor. Also, cutting of the single-crystal semiconductor wafer by the dicing saw keeps chippings increased in size from being produced.

Further, in the method of the present invention, spraying of cutting water takes place during cutting of the single-crystal semiconductor wafer after the phosphor formed on the single-crystal semiconductor wafer is covered with the protective film. This permits cooling and lubrication of the blade of the dicing saw and removal of swarf to be satisfactorily accomplished during cutting of the single-crystal semiconductor wafer without causing peeling of the phosphor. This prevents a reduction in luminance of the phosphor and short-circuiting between the element lines.

Further, the present invention significantly reduces a width of the dead space as compared with the prior art, to thereby increase the number of elements per one wafer.

Moreover, the protective film for covering the phosphor is evaporated during calcination of the phosphor in manufacturing of the fluorescent display device. Thus, the present invention eliminates any additional step of removing the protective film.

While a preferred embodiment of the present invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A method for processing a single-crystal semiconductor wafer for a fluorescent display device for manufacture of chips coated thereon with a phosphor and used as a display section of a fluorescent display device, comprising the steps of:

depositing a phosphor on each of a plurality of regions defined on said single-crystal semiconductor wafer at predetermined intervals;

forming a water resistant protective film on said phosphor; and cutting said single-crystal semiconductor wafer using cutting water at a high pressure for every one of said regions to prepare a plurality of chips.

2. A method as defined in claim 1, wherein said single-crystal semiconductor wafer is cut by means of a dicing saw.

3. A method as defined in claim 1, further comprising a step of removing said protective film from each of said chips.

4. A method as defined in claim 3, wherein said protective film is removed by calcination of said chips.

5. A method as defined in claim 4, wherein calcination of said chips is carried out in a calcination step in manufacturing of the fluorescent display device in which said chips are used as the display section.

* * * * *

UNITED STATES PATENT AND TRADEMARK OFFICE
CERTIFICATE OF CORRECTION

PATENT NO. : 6,037,191
DATED : March 14, 2000
INVENTOR(S) : Kenichi Honda et al.

Page 1 of 1

It is certified that error appears in the above-identified patent and that said Letters Patent is hereby corrected as shown below:

On the title page, item [30] has been omitted. The Foreign Application Priority Data should be:

--[30] Foreign Application Priority Data

Apr. 22, 1997 [JP] Japan...........9-104617--

Signed and Sealed this

Twelfth Day of June, 2001

*Attest:*

*Attesting Officer*

NICHOLAS P. GODICI
*Acting Director of the United States Patent and Trademark Office*